US010468385B2

(12) United States Patent
Lin et al.

(10) Patent No.: US 10,468,385 B2
(45) Date of Patent: Nov. 5, 2019

(54) SEMICONDUCTOR STRUCTURE INCLUDING PLURALITY OF CHIPS ALONG WITH AIR GAP AND MANUFACTURING METHOD THEREOF

(71) Applicant: TAIWAN SEMICONDUCTOR MANUFACTURING COMPANY LTD, Hsinchu (TW)

(72) Inventors: Wei-Heng Lin, Taipei (TW);
Tung-Liang Shao, Hsinchu (TW);
Chih-Hang Tung, Hsinchu County (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 15/826,545

(22) Filed: Nov. 29, 2017

(65) Prior Publication Data

US 2019/0164937 A1    May 30, 2019

(51) Int. Cl.
*H01L 25/065* (2006.01)
*H01L 21/56* (2006.01)
(Continued)

(52) U.S. Cl.
CPC .... *H01L 25/0657* (2013.01); *H01L 21/31111* (2013.01); *H01L 21/56* (2013.01);
(Continued)

(58) Field of Classification Search
CPC ........... H01L 25/0657; H01L 21/31111; H01L 21/56; H01L 23/291; H01L 23/315; H01L 23/66; H01L 24/05; H01L 24/11; H01L 24/13; H01L 24/16; H01L 24/81; H01L 25/50; H01L 2223/6627; H01L 2224/0401; H01L 2224/05022; H01L 2224/05024; H01L 2224/1146; H01L 2224/13005; H01L 2224/16145; H01L 2224/81191; H01L 2225/06513; H01L 2225/06568; H01L 2225/06582; H01L 2924/19032; H01L 2924/206; H01L 2924/2064 257/737; 438/613
See application file for complete search history.

(56) References Cited

U.S. PATENT DOCUMENTS

2010/0252906 A1* 10/2010 Tomiyasu ........... G02F 1/13454
257/506
2014/0239457 A1* 8/2014 Daubenspeck ......... H01L 23/34
257/621
(Continued)

*Primary Examiner* — Didarul A Mazumder
(74) *Attorney, Agent, or Firm* — WPAT, P.C., Intellectual Property Attorneys; Anthony King

(57) ABSTRACT

The present disclosure provides a semiconductor structure including a first chip having a first dielectric surface, a second chip having a second dielectric surface facing the first dielectric surface and maintaining a distance thereto, and an air gap between the second dielectric surface and the first dielectric surface. The first chip includes a plurality of first conductive lines in proximity to the first dielectric surface and parallel to each other, two adjacent first conductive lines each having a sidewall partially exposed from the first dielectric surface. The present disclosure further provides a method for manufacturing the semiconductor structure described herein.

19 Claims, 9 Drawing Sheets

(51) Int. Cl.
*H01L 23/31* (2006.01)
*H01L 23/00* (2006.01)
*H01L 23/29* (2006.01)
*H01L 25/00* (2006.01)
*H01L 21/311* (2006.01)
*H01L 23/66* (2006.01)

(52) U.S. Cl.
CPC .......... *H01L 23/291* (2013.01); *H01L 23/315* (2013.01); *H01L 23/66* (2013.01); *H01L 24/05* (2013.01); *H01L 24/11* (2013.01); *H01L 24/13* (2013.01); *H01L 24/16* (2013.01); *H01L 24/81* (2013.01); *H01L 25/50* (2013.01); *H01L 2223/6627* (2013.01); *H01L 2224/0401* (2013.01); *H01L 2224/05022* (2013.01); *H01L 2224/05024* (2013.01); *H01L 2224/1146* (2013.01); *H01L 2224/13005* (2013.01); *H01L 2224/16145* (2013.01); *H01L 2224/81191* (2013.01); *H01L 2225/06513* (2013.01); *H01L 2225/06568* (2013.01); *H01L 2225/06582* (2013.01); *H01L 2924/19032* (2013.01); *H01L 2924/206* (2013.01); *H01L 2924/2064* (2013.01)

(56) References Cited

U.S. PATENT DOCUMENTS

2016/0268230 A1* 9/2016 Lin .................... H01L 23/5329
2017/0110434 A1* 4/2017 Railkar ................ H01L 24/81

* cited by examiner

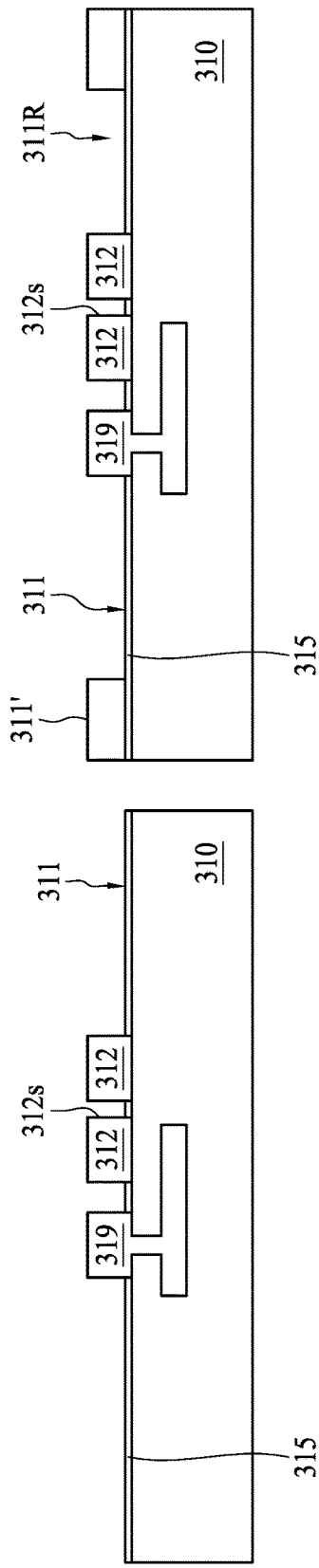

SEMICONDUCTOR STRUCTURE INCLUDING PLURALITY OF CHIPS ALONG WITH AIR GAP AND MANUFACTURING METHOD THEREOF

BACKGROUND

As feature sizes of integrated circuits continue to shrink to meet performance demands and overall chip dimensions increase, the interconnect structure consumes more of the available power and delay budgets for integrated circuits. As wiring has become more expensive and clock frequencies have increased, designers have investigated three-dimensional integration as a means of reducing signaling across chips.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of the decreased length of interconnects between the stacked dies, as examples.

3DICs have multiple layers of active components. The active components can be wired to devices on the same and/or different layers. In one approach, multiple conventional wafers are arranged together in a stack with some means of interconnecting the conventional circuits. Wafers can be bonded face-to-face (i.e., such that the metallizations are adjacent), face-to-back (i.e., such that the metallization layers of one wafer face the substrate of a second wafer) or back-to-back (i.e., such that the substrate of one wafer faces the substrate of a second wafer) using interconnects formed in high-aspect-ratio vias through the device area of the upper wafer. Following bonding of the wafers, the stack is packaged.

An improved three-dimensional integration structure and method are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
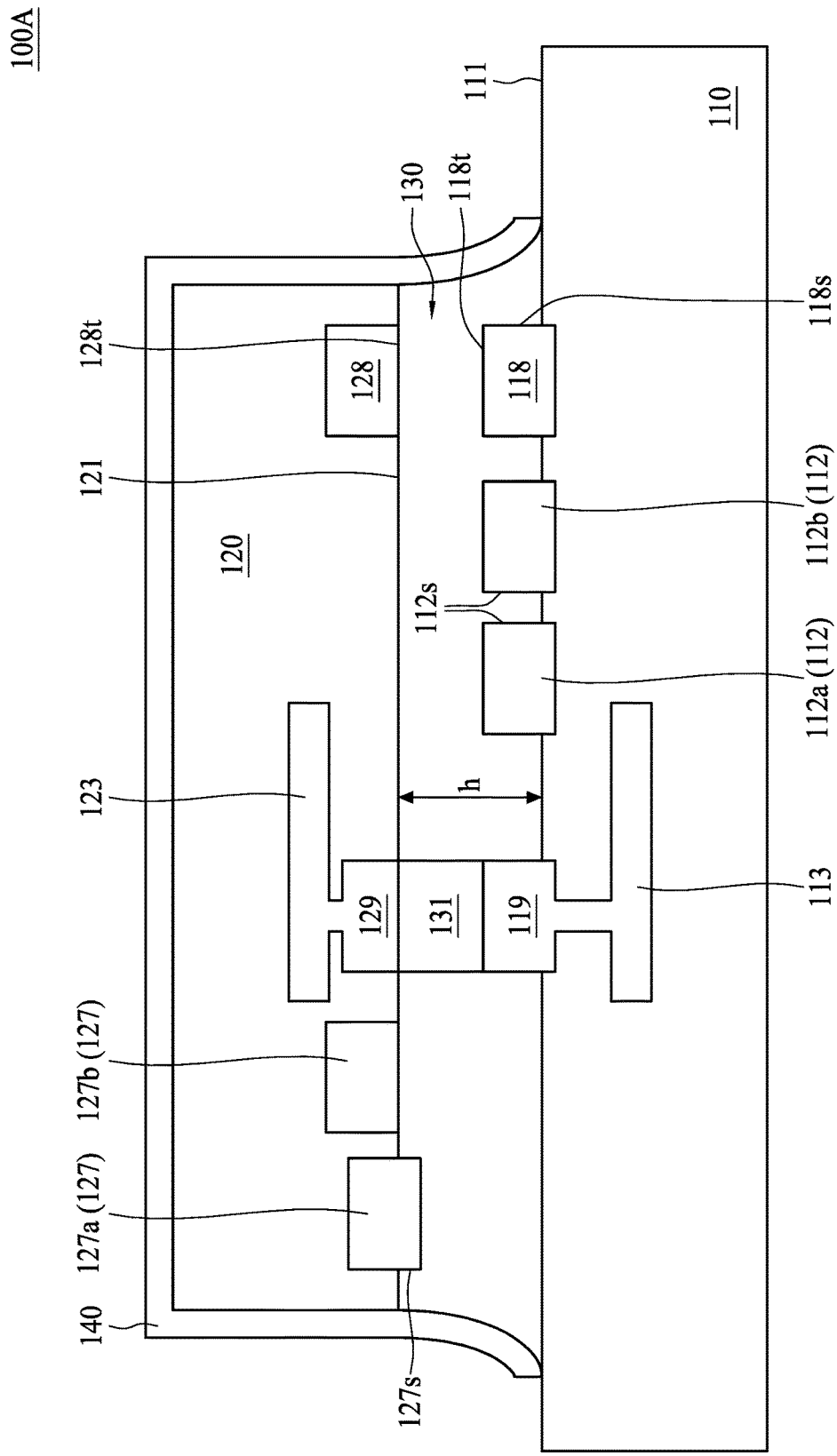
FIG. 1A is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

With the advancement of electronic technology, semiconductor devices are becoming increasingly smaller in size while having greater functionality and greater amounts of integrated circuitry. Conventionally, circuits or signal lines in a semiconductor structure are embedded in or surrounded by dielectric material such as oxides or nitrides. As semiconductor structures become more and more compact, many problems as to the performance and power efficiency of a semiconductor device may occur.

For example, as circuits or signal lines (hereinafter "microstrip") within one chip are designed to be very compact, critical dimension between adjacent microstrip become very small. Reduced critical dimension increases capacitive coupling, especially when the adjacent signal lines are parallel to each other. Higher capacitive coupling results in a greater RC delay, which further leads to higher switching power loss, poor signal integrity, and decreased data rate of the chip.

In the case of a multi-chip package, small critical dimension is usually adopted for microstrip-related structure. The gap between microstrips is usually filled with underfill or dielectric material such as oxides or nitrides. When the distance between two stacking chips becomes smaller, microstrips of the two chips become closer. Same as the above, greater capacitive coupling between microstrips of the two stacking chips, compared to the single-chip counterpart, becomes a problem to be solved when developing multi-chip system.

Chip-on-wafer-on-substrate (CoWoS), a type of multi-chip packaging with an interposer between chips and a substrate, was introduced for integrating multiple chips. Conductive pads designed to receive microbumps are connected to signal lines or other microstrip structure thereunder. Normally the microstrip structure is embedded in or merely exposing a top surface from dielectric material such as oxides or nitrides for complying with current manufacturing operations. On the other hand, conventional microbumps used to bond a chip on the interposer usually have a height of from about 40 nm to 50 nm, and the microbumps are subsequently protected by underfill materials. When microbumps with a smaller height, for example, from about 0.3 nm to 5 nm, are desired, the vertical distance between microstrips in the chip and in the interposer reduces at least one order of magnitude. The drastic distance reduction due to smaller microbump size inevitably increases vertical coupling between microstrips, and hence deteriorating device performance.

In another example, RF transmission line structure, which includes a conducting line separated from a ground line by a dielectric layer, also suffers the increase of vertical coupling when chip stacking distance being reduced. A dielectric constant of the dielectric layer and a distance between the conducting line and the ground line, together with other factors, determines the characteristics of the RF transmission line structure. If the dielectric layer between the conducting line and the ground line has a large dielectric constant, the distance between the conducting line and the ground line cannot be made too small. Therefore, conventionally, RF transmission line structure has physical limitation to reduce its packaging size.

The general purpose of the present disclosure provides one or more of the following advantages: (1) implementing an air gap between parallel conductive lines to reduce the coupling between the laterally parallel conductive lines, thereby reducing the switching power loss, improving signal integrity and increasing data rate of the system; (2) implementing an air gap in a multi-chip system to reduce vertical stacking scale without increasing the coupling between conductive lines of stacking chips; (3) implementing an air gap in a microstrip structure, for example, an RF transmission line, to allow a reduced size for microstrip structure-related semiconductor package.

FIG. 1A is a cross sectional view of a semiconductor structure 100A in accordance with some embodiments of the present disclosure. The semiconductor structure 100A includes a first chip 110, a second chip 120, and an air gap 130 between the first chip 110 and the second chip 120. In some embodiments, the semiconductor structure 100A is a semiconductor package, for example, a 3D integrated circuit package.

In the present embodiment, the first chip 110 includes a first dielectric surface 111, and the second chip 120 includes a second dielectric surface 121. For example, the second dielectric surface 121 can be parallel to the first dielectric surface 111. As shown in FIG. 1A, the second dielectric surface 121 faces the first dielectric surface 111 and maintains a distance h from the first dielectric surface 111. The air gap 130 is between the first dielectric surface 111 and the second dielectric surface 121.

In some embodiments, the first chip 110 includes a plurality of first conductive lines 112. The first conductive lines 112 can be disposed in proximity to the first dielectric surface 111. For example, the first conductive lines 112 are parallel or adjacent to each other. In some embodiments, each of two adjacent first conductive lines 112 has a sidewall 112s. As shown in FIG. 1A, a sidewall 112s of a first conductive line 112a is exposed from and partially above the first dielectric surface 111. Another first conductive line 112b adjacent to the first conductive line 112a also possesses a sidewall 112s exposed from and partially above the first dielectric surface 111. The electrical coupling between two conductive lines 112a and 112b can be effectively reduced especially in compact routing due to the low dielectric constant of the air gap 130. In this connection, the exposed portion of the sidewall 112s of the first conductive line 112a and the exposed portion of the sidewall 112s of the first conductive line 112b are facing each other and separated by air gap 130. Alternatively stated, remaining portions of sidewall 112s of the first conductive line 112a and the second conductive line 112b under the first dielectric surface 111 are separated from each other by the first chip 110.

As shown in FIG. 1A, the first chip 110 can further include a first inner conductive line 113 disposed under the first dielectric surface 111. In the present embodiment, the first inner conductive line 113 is not exposed from the first dielectric surface 111.

As shown in FIG. 1A, the second chip 120 can further include a second inner conductive line 123 disposed above the second dielectric surface 121. In the present embodiment, the second inner conductive line 123 is not exposed from the second dielectric surface 121.

The first inner conductive line 113 and the second inner conductive line 123 can be electrically connected. As shown in FIG. 1A. The first inner conductive line 113 and the second inner conductive line 123 are electrically connected by a microbump 131, a first pad 119, a second pad 129 and other conductive members (not labeled) such as via structures. In the present embodiment, the microbump 131 is disposed between the first dielectric surface 111 and the second dielectric surface 121, and within the air gap 130. The first pad 119 has a sidewall partially exposed from the first dielectric surface 111 and the second pad 129 is embedded in the second chip 120. However, the present disclosure is not limited thereto, for example, the second pad 129 can also has a sidewall exposed from the second dielectric surface The microbump 131 may include solder or ENEPIG, and a height or thickness of the microbump can be, for example, from about 0.3 nm to about 5 nm. In some embodiments, the microbump 131 is configured to support the combined structure of the first chip 110 and the second chip 120, and a height or thickness of the microbump critically affects the distance h which can be maintained between the first dielectric surface 111 and the second dielectric surface 121. A small height of the microbump 131 can realize a thin and compact semiconductor structure 100A.

In the present embodiment, a size of the second chip 120 is smaller than a size of the first chip 110. For example, an area of the second chip 120 is smaller than an area of the first chip 110 from a top view perspective. In other embodiments, an area of the second chip 120 is substantially equal to an area of the first chip 110 from a top view perspective.

The semiconductor structure 100A can further include a protection layer 140 sealing the air gap 130. In the present embodiment shown in FIG. 1A, the protection layer 140 covers both the air gap 130 and a back side of the second chip 120. In other embodiments, the protection layer 140 may only laterally seals and surrounds the air gap 130, without covering the back side of the second chip 120. The protection layer 140 can be composed of tetraethoxysilane (TEOS) or nitrides. The protection layer 140 is to protect the first conductive lines 112, the microbump 130, and other conductive members in the air gap 130 by preventing underfill or molding applied in subsequent operations extending into the air gap 130.

The second chip 120 can further include one or more second conductive lines 127. For example, in FIG. 1A, a second conductive line 127b is in the second chip 120 without exposing a sidewall from the second dielectric surface 121. Another second conductive line 127a has a sidewall 127s exposed from the second dielectric surface 121 and extending into the air gap 130.

In some embodiments, the first chip 110 can further include a third conductive line 118, and the second chip 120 can further include a fourth conductive line 128, wherein the third conductive line 118 and the fourth conductive line 128 projectively correspond to each other, that is, at least a portion of the third conductive line 118 overlaps with the fourth conductive line 128 from a top view perspective. As shown in FIG. 1A, the third conductive line 118 is in proximity to the first dielectric surface 111 and has a surface 118t exposed from the first dielectric surface 111. The fourth conductive line 128 is in proximity to the second dielectric surface 121 and has a surface 128t exposed from the second dielectric surface 121. The surface 118t of the third conductive line 118 faces and overlaps with the surface 128t of the fourth conductive line 128 in a top view perspective. In the present embodiment, the third conductive line 118 further has a sidewall 118s exposed from the first dielectric surface 111. Although not having a sidewall exposed from the second dielectric surface 121, as illustrated in FIG. 1A, the fourth conductive line 128 may also have a sidewall exposed from the second dielectric surface 121 in another embodiment. In some embodiments, electrical coupling between the third conductive line 118 and the fourth conductive line 128 can be effectively reduced at a distance under 10 micrometer due to the low dielectric constant of the air gap 130.

The first conductive lines 112, the first inner conductive line 113, the second inner conductive line 123, the pad 119, the pad 129, the second conductive lines 127, the third conductive line 118 or the fourth conductive line 128 may include gold, silver, copper, nickel, tungsten, aluminum, titanium, palladium and/or alloys thereof.

Figure 1B:
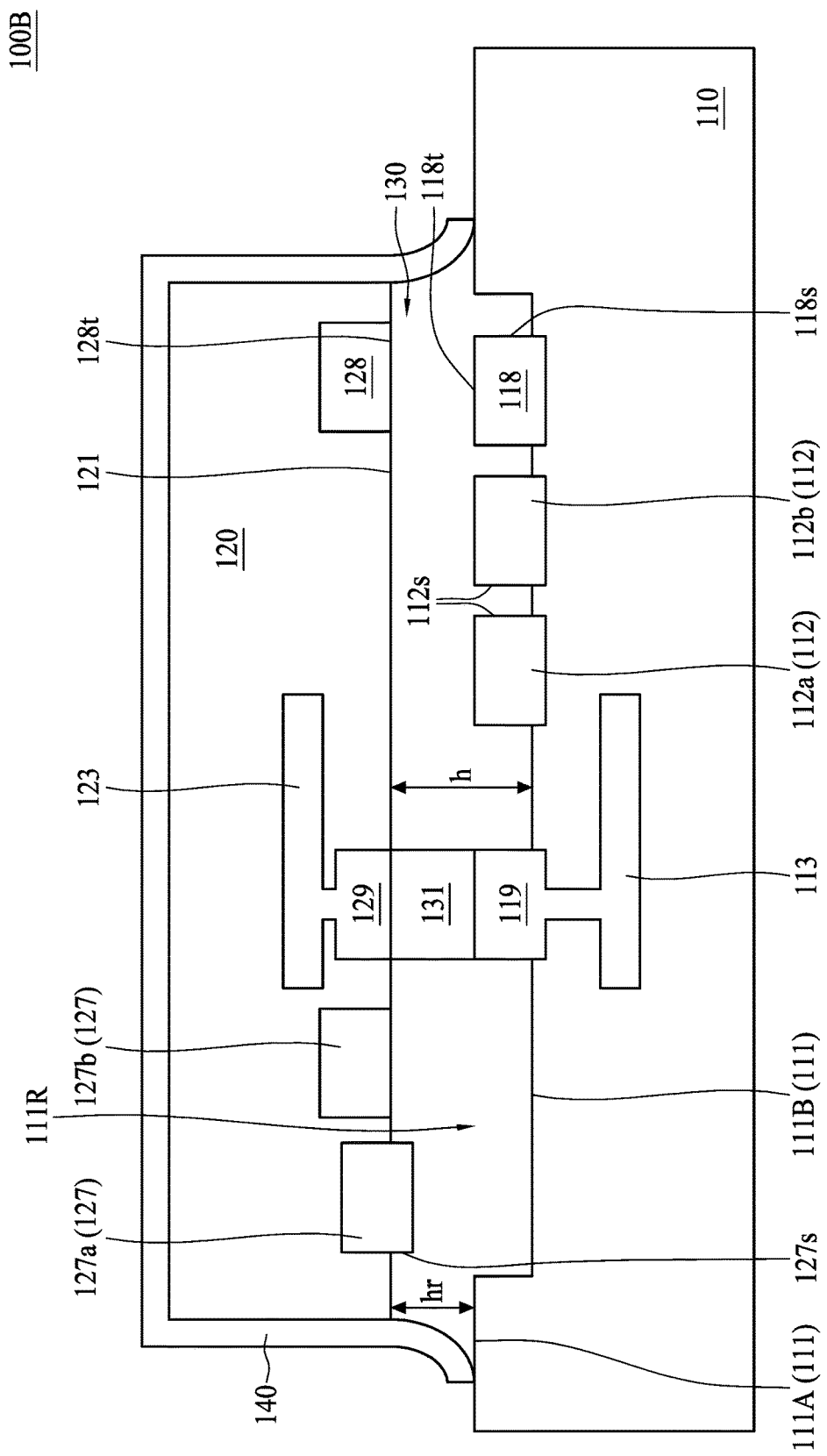
FIG. 1B is a cross section of a semiconductor structure, in accordance with some embodiments of the present disclosure.

FIG. 1B is a cross sectional view of a semiconductor structure 100B, in accordance with some embodiments of the present disclosure. Identical numeral annotations represent identical or similar elements and would not be repeated herein for brevity. A difference between the semiconductor package 100B and the semiconductor package 100A lies in that, a recess 111R is formed on the first dielectric surface 111, thereby the first dielectric surface 111 includes a first portion 111A and a second portion 111B. As shown in FIG. 1B, the first portion 111A is under the periphery of the projection of the second dielectric surface 121, whereas the second portion 111B is under relatively center of the projection of the second dielectric surface 121. In some embodiments, the first portion 111A surrounds the second portion 111B. The first portion 111A is vertically higher than the second portion 111B, such that a distance hr between the second dielectric surface 121 and the first portion 111A is shorter than the distance h between the second dielectric surface 121 and the second portion 111B. That is, between the first chip 110 and the second chip 120, a gap at the periphery of the stacked semiconductor structure 100B can be reduced, while a gap at the center of the semiconductor structure 100B can be kept at an appropriate distance for the deposition of the conductive lines, the pads, or the microbumps described above. In some embodiments, the reduced distance hr can improve the reliability for the deposition of the protection layer 140, for example, the protection layer 140 forms a continuous film bridging the sidewall of the second ship 120 and the first dielectric surface 111 of the first chip 110.

Figure 2:
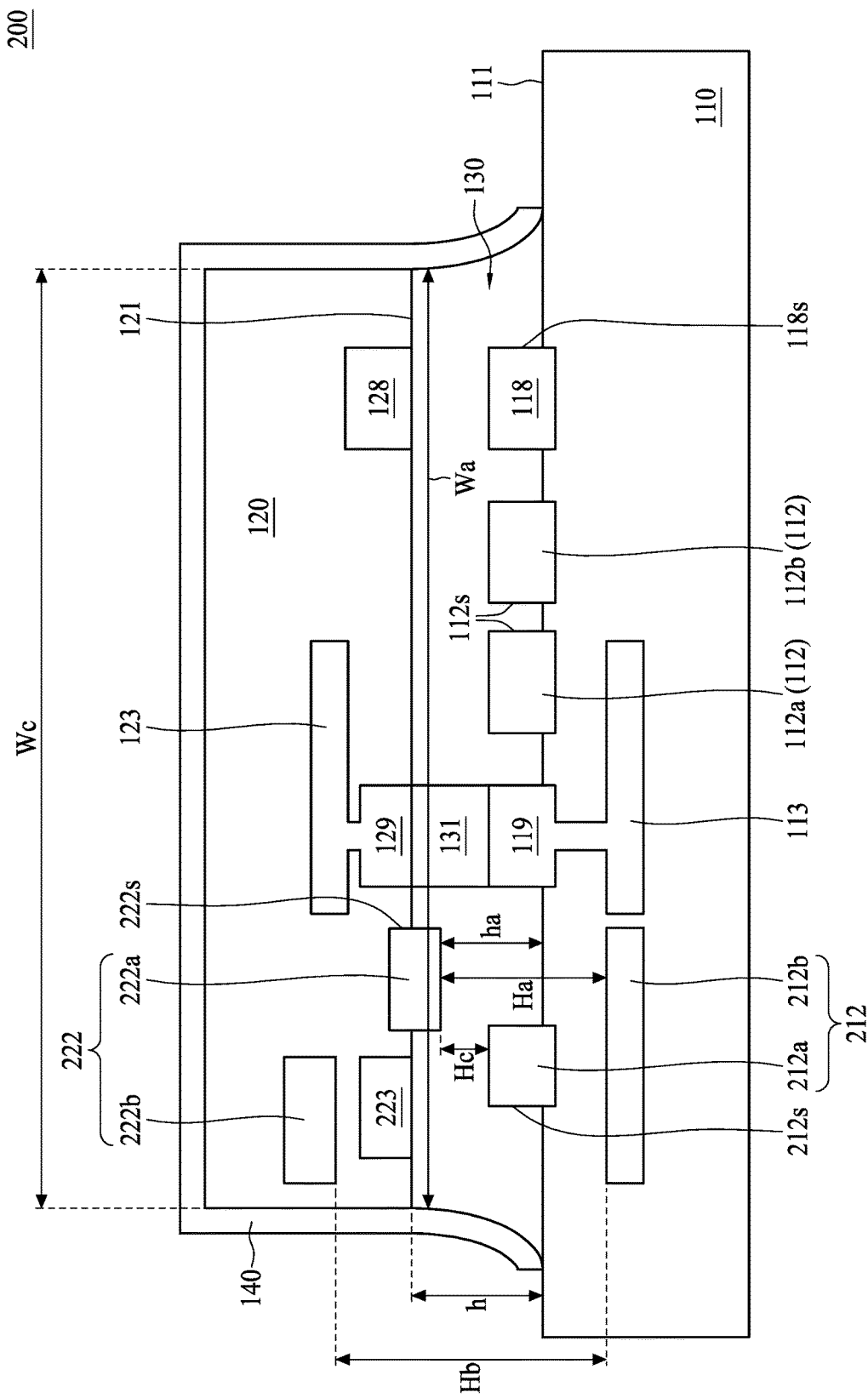
FIG. 2 is a cross section of a semiconductor structure, in accordance with some embodiments of the present disclosure.

FIG. 2 is a cross sectional view of a semiconductor structure 200, in accordance with some embodiments of the present disclosure. Identical numeral annotations represent identical or similar elements and would not be repeated herein for brevity. A difference between the semiconductor package 200 and the semiconductor package 100 lies in that, for the semiconductor package 200, the first chip 110 includes an additional first conductive line 212 and the second chip 120 includes an additional second conductive line 222. In some embodiments, the first conductive line 212 can be several conductive lines 212a, 212b exposed from the first dielectric surface 111 or embedded in the first chip 110. In some embodiments, the second conductive line 222 can be several conductive lines 222a, 222b exposed from the second dielectric surface 121 or embedded in the second chip 120.

In the present embodiment, either of the first conductive lines 212a, 212b is in proximity to the first dielectric surface 111. For example, as shown in FIG. 2, a first conductive line 212a has a sidewall 212s and a top surface exposed from the first dielectric surface 111, and another first conductive line 212b is embedded in the first chip 110. Similarly, either of the second conductive lines 222a, 222b is in proximity to the second dielectric surface 121. For example, as shown in FIG. 2, a second conductive line 222a has a sidewall 222s and a bottom surface exposed from the second dielectric surface 121, and another second conductive line 222b is embedded in the second chip 120. The second chip 120 can further include a metal line 223 closer to the second dielectric surface 121 than the second conductive line 222b. The metal line 223 can be a top metal line. In some embodiments, the second conductive line 222 may have only one surface exposed from the second dielectric surface 121. In some embodiments, either of the first conductive lines 212a, 212b can be a ground line and either of the second conductive lines 222a, 222b can be a signal line, or alternatively, either of the first conductive lines 212a, 212b can be a signal line and either of the second conductive lines 222a, 222b can be a ground line.

As shown in FIG. 2, between the first conductive line 212 and the second conductive line 222, there are an air portion and a dielectric portion. For example, an air portion has a thickness ha shorter than the distance Ha between the first conductive line 212b and the second conductive line 222a. Another air portion possesses a thickness h (that is, the thickness of the air gap 130) shorter than the distance Hb between the first conductive line 212b and the second conductive line 222b. A ratio between ha and Ha can be in a range of from about 15% to 80%. A ratio between h and Hb can also be in a range of from about 15% to 80%. Between the first conductive line 212a and the second conductive line 222a, there is only an air portion and no dielectric portion, and thus a ratio of a thickness Hc of the air portion to a distance between the first conductive line 212a and the second conductive line 222a (the distance is also Hc here) is 100%.

The combination of the first conductive line 212 and the second conductive line 222 can be part of a microstrip structure or an RF transmission line structure. With the low dielectric constant of the air gap 130, a size of the combination of the first conductive line 212 and the second conductive line 222 can be reduced without increasing the electrical coupling. For example, a height or thickness of the microbump 131 can be in a range of from about 0.3 nm to 5 nm. In the present embodiment, the air gap 130 has a width Wa at least substantially equal to a width We of the second chip.

Figure 3A:
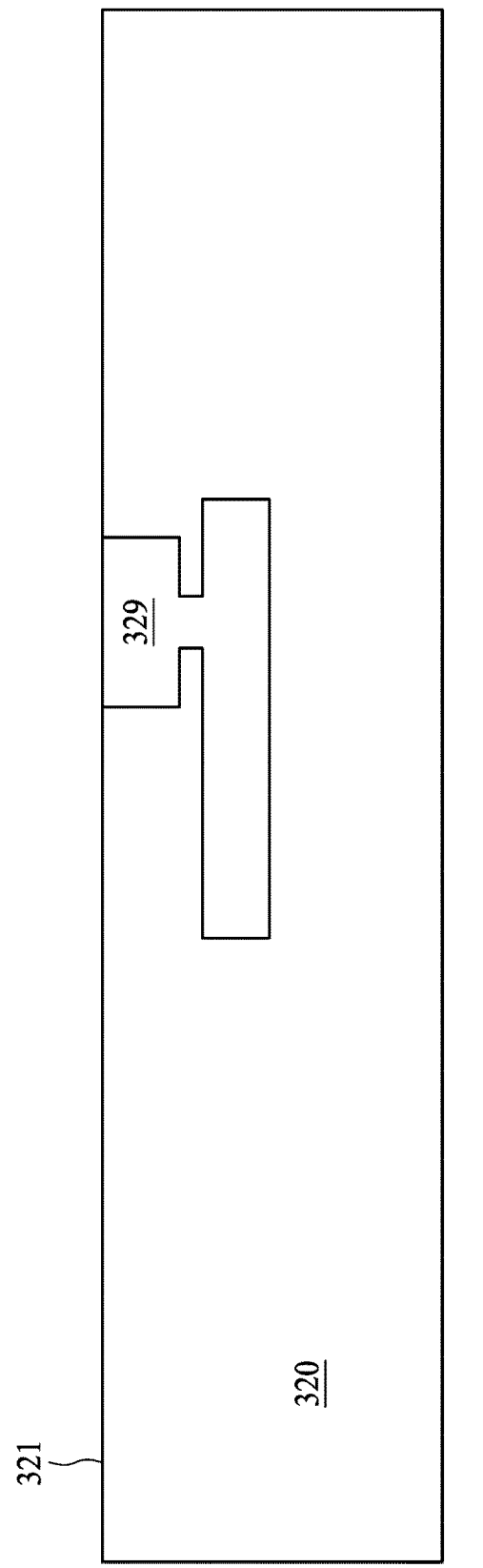
FIGS. 3A, 3B, 3B', 3C, 3D, 3D', 3E, and 3F are cross sections of operations for manufacturing a semiconductor structure, in accordance with some embodiments of the present disclosure.

FIG. 3A to FIG. 3F show cross sectional views of various operations in a method for manufacturing a semiconductor package 300, in accordance with some embodiments of the present disclosure. In FIG. 3A, a first die 320 is received.

Figure 3B:
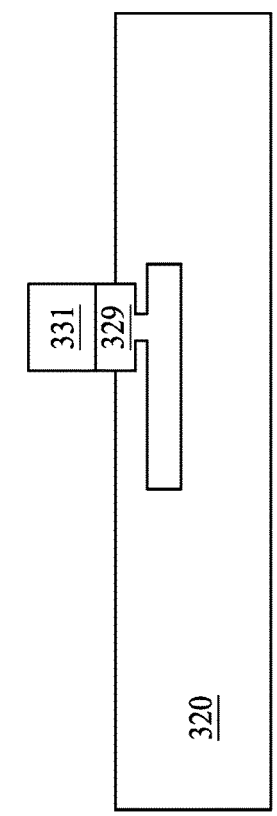
Figure 3B:
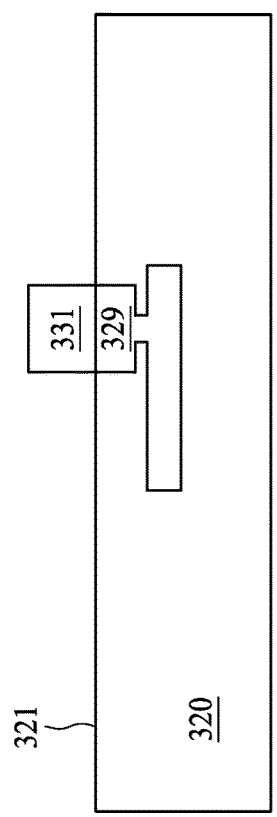

The first die 320 has a first dielectric surface 321 and a metal pad 329 in proximity to the first dielectric surface 321. For the purpose of clarity, only a dielectric portion of the first die 320 is illustrated in FIG. 3A and the following figures. The substrate or active portion of the first die 320 is omitted. It should be understood by people having ordinary skill in the art that the location where the metal pad 329 resides is a front side of the first die 320. In the present embodiment, the metal pad 329 has a surface exposed from the first dielectric surface 321. As previously discussed, the first die 320 has a smaller area than a second die 310 to be bonded with (see FIG. 3C). A top surface of the metal pad 329 in the first die 320 can either be coplanar with the dielectric surface 321 or elevated from the dielectric surface 321. For example, as shown in FIG. 3B, a microbump 331 is formed on the metal pad 329 coplanar with the dielectric surface 321 by suitable operations such as a plating operation. In some embodiments, as shown in FIG. 3B', a dielectric etching operation can be performed after the formation of the microbump 331 to expose a sidewall of the metal pad 329. The size of the microbump 331, together with other factors, determines the size of the semiconductor package 300. A height or thickness of the microbump 131 can be from about 0.3 nm to about 5 nm, to realize a small and compact semiconductor package 300.

Figure 3C:
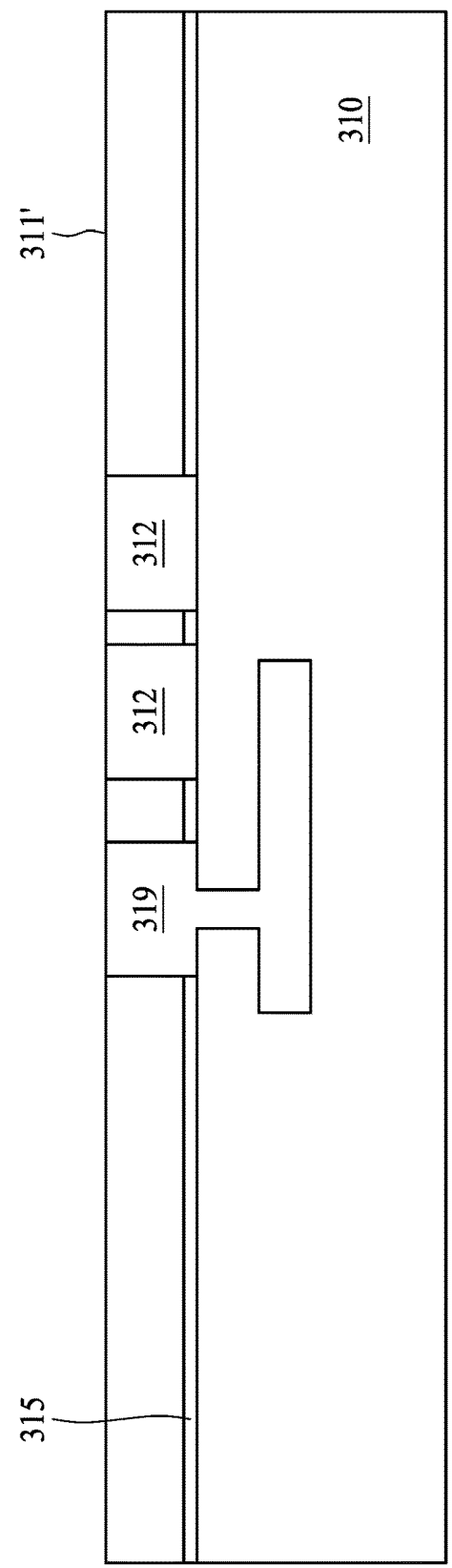

In FIG. 3C, a second die 310 is received. The second die 310 has a plurality of conductive lines 312 and a metal pad 319 in proximity to a surface 311'. For the purpose of clarity, only a dielectric portion of the second die 310 is illustrated in FIG. 3C and the following figures. The substrate or active portion of the second die 310 is omitted. It should be understood by people having ordinary skill in the art that the location where the conductive lines 312 and the metal pad 319 reside is a front side of the second die 310. The plurality of conductive lines 312 can be parallel to each other and configured to carry electrical signals. In some embodiments, as shown in FIG. 3C, the second die 310 can further include an etch stop layer 315 leveling with, for example, a bottom of one of the plurality of conductive lines 312 or a bottom of the metal pad 319. The etch stop layer 315 is formed before the formation of the conductive lines 312 and the metal pad 319, and can be formed by, for example, a chemical vapor deposition (CVD) process. The etch stop layer 315 functions as an etch stop during the dielectric recess operation, as illustrated in FIG. 3D. In FIG. 3D, a dielectric etching operation is performed to expose a sidewall 312s of the plurality of conductive lines 312, a surface of the metal pad 319, and a second dielectric surface 311 of the second die 310. The dielectric etching operation can include, for example, an oxide recess operation by hydrofluoride chemistry. In some embodiments, the etch stop layer 315 is configured to determine a position of the second dielectric surface 311 during the dielectric etching operation. FIG. 3D' illustrates another example of the dielectric etching operation. In FIG. 3D', the dielectric etching operation is performed only in a center portion of the surface 311' by a photolithography operation, resulting the formation of a recess 311R in a second portion of the surface 311', and the recess 311R being surrounded by a first portion of the surface 311', which was not removed during the photolithography operation. In some embodiments, the dielectric etching operation illustrated in FIG. 3D' is part of the manufacturing processes of the semiconductor structure 100B of FIG. 1B.

As described above, one dielectric etching operation is performed on the first dielectric surface 321 of the first dies 320 in order to expose a sidewall of the metal pad 329. Another dielectric etching operation is performed on the surface 311' of the second die 310, before or after that on the first dielectric surface 321 of the first dies 320, in order to expose a second dielectric surface 311. In some embodiments, the two dielectric etching operations can be performed simultaneously or with any suitable sequence.

Figure 3E:
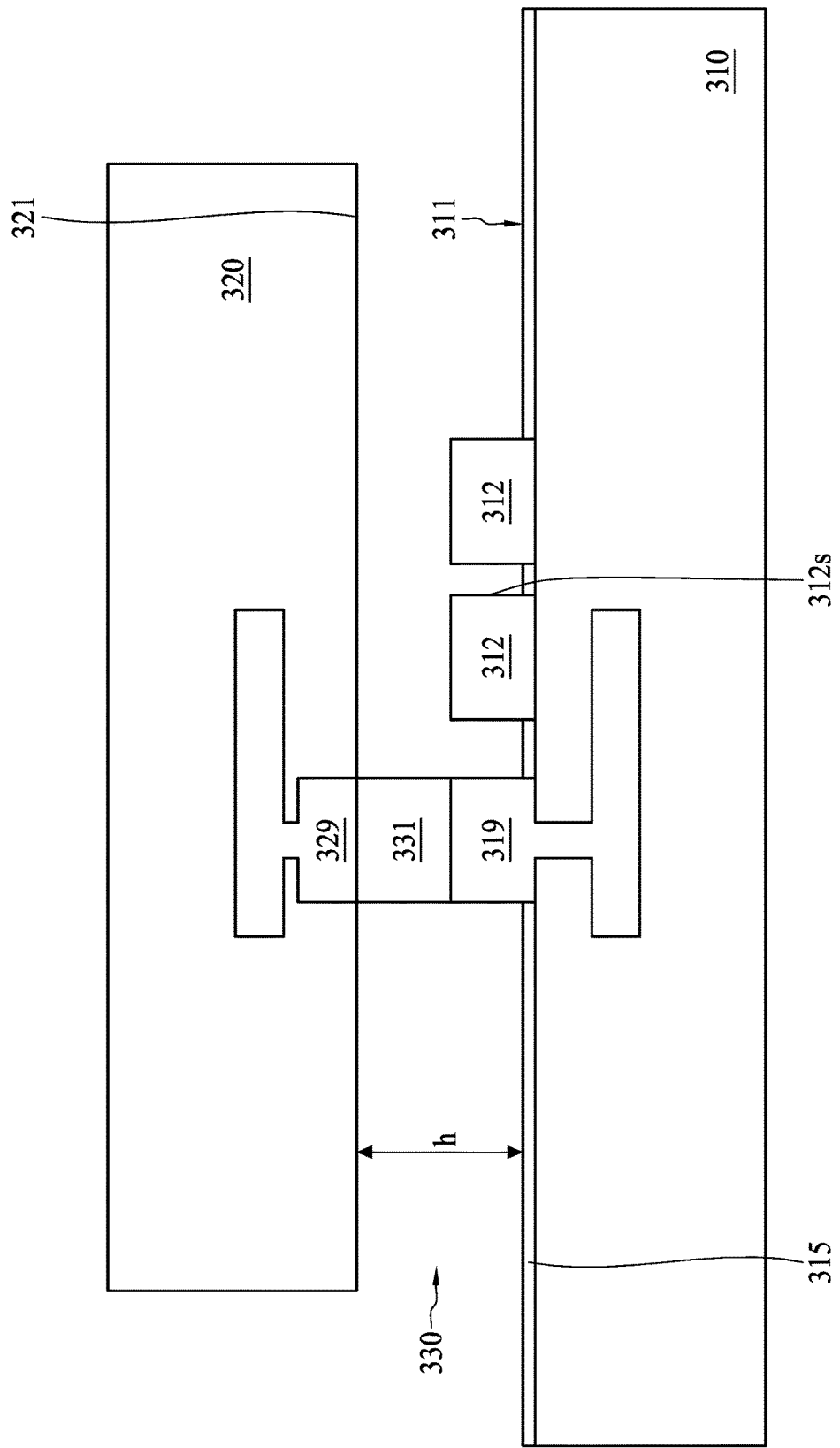

In FIG. 3E, the first die 320 and the second die 310 are bonded together through the microbump 331. In the present embodiment, prior to the bonding of the first die 320 and the second die 310, the microbump 331 was originally bonded with the metal pad 329 of the first die 320. After the bonding of the first die 320 and the second die 310, microbump 331 connects the metal pad 329 of the first die 320 and the metal pad 319 of the second die 310. As shown in FIG. 3E, a distance h is maintained between the first dielectric surface 321 and the second dielectric surface 311, thereby forming an air gap 330. The bonding of the first die 320 and the second die 310 can include any suitable operations such as a flip-chip operation, an alignment operation or a reflow operation.

Figure 3F:
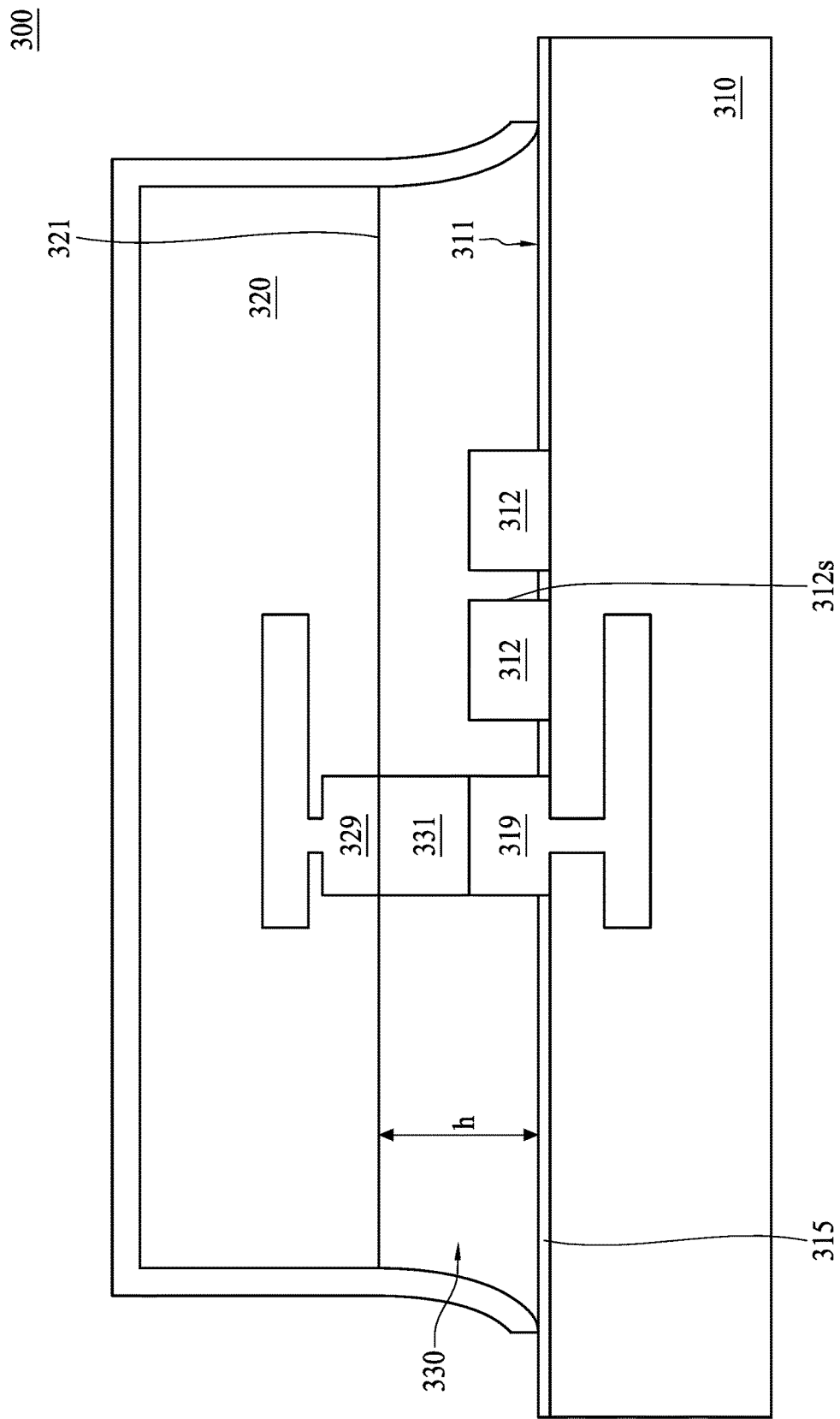

In FIG. 3F, a deposition operation is performed to laterally seal the air gap 330. The deposition operation can be a physical vapor deposition (PVD) or a chemical vapor deposition (CVD), and can include a blanket nitride or oxide such as TEOS deposition over the bonded first die 320. As shown in FIG. 3F, in addition to the lateral gap between the first dielectric surface 321 and the second dielectric surface 311, a backside and a sidewall of the first die 320 is also covered with the nitride or oxide materials.

Some embodiments of the present disclosure provide a semiconductor structure including a first chip having a first dielectric surface, a second chip having a second dielectric surface facing the first dielectric surface and maintaining a distance thereto, and an air gap between the second dielectric surface and the first dielectric surface. The first chip includes a plurality of first conductive lines in proximity to the first dielectric surface and parallel to each other, two adjacent first conductive lines each having a sidewall partially exposed from the first dielectric surface.

Some embodiments of the present disclosure provide a semiconductor structure, including a first chip having a first dielectric surface, a second chip having a second dielectric surface facing the first dielectric surface and maintaining a distance thereto, and an air gap between the second dielectric surface and the first dielectric surface. The first chip includes a first conductive line in proximity to the first dielectric surface. The second chip includes a second conductive line in proximity to the second dielectric surface. The air gap has a width at least substantially equal to a width of the second chip.

Some embodiments of the present disclosure provide a method for manufacturing a semiconductor structure, the method including (1) receiving a first die having a first dielectric surface and a metal pad in proximity to the first dielectric surface; (2) forming a microbump on the metal pad through a plating operation; (3) receiving a second die having a plurality of conductive lines; (4) exposing a sidewall of one of the plurality of conductive lines by a dielectric etching operation and exposing a second dielectric surface of the second die; (5) bonding the first die and the second die through the microbump while maintaining a distance between the first dielectric surface and the second dielectric surface and thereby forming an air gap; and (6) laterally sealing the air gap through a deposition operation.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a first chip having a first dielectric surface, the first chip comprising:
a plurality of first conductive lines in proximity to the first dielectric surface and parallel to each other, two adjacent first conductive lines of the plurality of first conductive lines, each having a sidewall partially exposed and protruding from the first dielectric surface;
a second chip having a second dielectric surface facing the first dielectric surface and maintaining a distance thereto; and
an air gap between the second dielectric surface and the first dielectric surface, wherein an entire top surface of the plurality of first conductive lines is exposed to the air gap, wherein the entire top surface of the plurality of first conductive lines is planar surface with each other.

2. The semiconductor structure of claim 1, further comprising a first inner conductive line under the first dielectric surface.

3. The semiconductor structure of claim 2, further comprising a second inner conductive line above the second dielectric surface.

4. The semiconductor structure of claim 3, wherein the first inner conductive line and the second inner conductive line are electrically connected by a microbump.

5. The semiconductor structure of claim 4, wherein a height of the microbump is from about 0.3 μm to about 5 μm.

6. The semiconductor structure of claim 1, further comprising a protection layer laterally sealing the air gap.

7. The semiconductor structure of claim 6, wherein the protection layer further covers the second chip.

8. The semiconductor structure of claim 1, wherein a size of the second chip is smaller than a size of the first chip from a top view perspective.

9. The semiconductor structure of claim 1, further comprising a second conductive line exposed from the second dielectric surface.

10. The semiconductor structure of claim 9, wherein the second conductive line has a sidewall exposed from the second dielectric surface.

11. The semiconductor structure of claim 1, further comprising a third conductive line in proximity to the first dielectric surface and having a surface exposed from the first dielectric surface, and a fourth conductive line in proximity to the second dielectric surface and having a surface exposed from the second dielectric surface, wherein the third conductive line and the fourth conductive line projectively correspond to each other.

12. The semiconductor structure of claim 11, wherein the third conductive line comprises a sidewall exposed from the first dielectric surface.

13. The semiconductor structure of claim 1, wherein the sidewall of the two adjacent first conductive lines exposed from the first dielectric surface is in contact with the air gap.

14. A semiconductor structure, comprising:
a first chip having a first dielectric surface, the first chip comprising:
a first conductive line in proximity to the first dielectric surface;
a second chip having a second dielectric surface facing the first dielectric surface and maintaining a distance thereto, the second chip comprising:
a second conductive line in proximity to the second dielectric surface; and
an air gap between the second dielectric surface and the first dielectric surface, the air gap having a width at least substantially equal to a width of the second chip,
wherein the first conductive line is protruding from the first dielectric surface thereby exposing a sidewall and an entire top surface of the first conductive line to the air gap, wherein the entire top surface of the first conductive line has a planar surface.

15. The semiconductor structure of claim 14, further comprising a protection layer laterally sealing the air gap.

16. A semiconductor structure, comprising:
a first chip having a first dielectric surface, the first chip comprising:
a first inner conductive line under the first dielectric surface;
a second chip having a second dielectric surface facing the first dielectric surface and maintaining a distance thereto, the second chip comprising:
a second inner conductive line above the second dielectric surface;
a microbump having a height from about 0.3 μm to about 5 μm electrically connecting the first inner conductive line and the second inner conductive line;
an air gap between the second dielectric surface and the first dielectric surface;
a protection layer laterally sealing the air gap; and
a first conductive line protruding from the first dielectric surface, wherein an entire top surface of the first conductive line is exposed to the air gap, wherein the entire top surface of the first conductive line has a planar surface.

17. The semiconductor structure of claim 16, further comprising:
a plurality of first conductive lines in proximity to the first dielectric surface and parallel to each other, two adjacent first conductive lines of the plurality of first conductive lines, each having a sidewall partially exposed from the first dielectric surface.

18. The semiconductor structure of claim 17, further comprising a second conductive line exposed from the second dielectric surface.

19. The semiconductor structure of claim 16, wherein the protection layer is composed of tetraethoxysilane (TEOS) or nitrides.

* * * * *